United States Patent
Wills et al.

(10) Patent No.: US 9,835,676 B2
(45) Date of Patent: Dec. 5, 2017

(54) DYNAMIC CHARACTERISATION OF AMPLIFIER USING MULTIPLE ENVELOPE SHAPING FUNCTIONS

(71) Applicant: SNAPTRACK, INC., San Diego, CA (US)

(72) Inventors: Garvin Wills, Cambourne (GB); Gerard Wimpenny, Cambourne (GB)

(73) Assignee: SnapTrack, Inc., San Diego, CA (US)

( * ) Notice: Subject to any disclaimer, the term of this patent is extended or adjusted under 35 U.S.C. 154(b) by 566 days.

(21) Appl. No.: 14/389,106

(22) PCT Filed: Mar. 28, 2013

(86) PCT No.: PCT/EP2013/056666
§ 371 (c)(1),
(2) Date: Sep. 29, 2014

(87) PCT Pub. No.: WO2013/144275
PCT Pub. Date: Oct. 3, 2013

(65) Prior Publication Data
US 2015/0088445 A1   Mar. 26, 2015

(30) Foreign Application Priority Data

Mar. 30, 2012  (GB) .................................. 1205744.4

(51) Int. Cl.
*G01R 31/28*   (2006.01)
*G01R 25/00*   (2006.01)
(Continued)

(52) U.S. Cl.
CPC ......... *G01R 31/2836* (2013.01); *G01R 25/00* (2013.01); *H03F 1/0222* (2013.01);
(Continued)

(58) Field of Classification Search
CPC ... G01R 31/2836; G01R 25/00; H03F 1/0222; H03F 1/0227; H03F 1/3241;
(Continued)

(56) References Cited

U.S. PATENT DOCUMENTS

| 6,725,021 B1* | 4/2004 | Anderson ............. H03F 1/0222 330/297 |
| 2009/0004981 A1 | 1/2009 | Eliezer et al. |
| 2009/0302941 A1* | 12/2009 | Wimpenny ........... H03F 1/0227 330/199 |

OTHER PUBLICATIONS

Officer: H. Fritzsche, "Related International Application No. PCT/EP2013/056666", "International Prelminary Report on Patentability", dated Oct. 9, 2014, Publisher: International Bureau of WIPO, Published in: CH.

(Continued)

*Primary Examiner* — Manuel L Barbee
(74) *Attorney, Agent, or Firm* — Patterson & Sheridan, LLP

(57) ABSTRACT

A method of characterizing an envelope tracking amplification stage, the method comprising: generating an input test waveform which is representative of an input waveform under normal operating conditions of the amplification stage; applying a respective one of a plurality of different shaping functions, each comprising a non-linear transfer function, to the input signal envelope in each of a plurality of test periods during the period in which the input test waveform is applied as the input signal to generate the input to the envelope tracking modulated supply voltage; measuring parameters of the amplification stage during the period in which the input test waveform is applied in order to allow determination of the gain, phase and efficiency characteristics of the amplifier; and for each of the gain, phase and efficiency characteristics, generating a three dimensional (Continued)

plot of the characteristic with respect to input power and supply voltage applied to the amplifier.

20 Claims, 8 Drawing Sheets

(51) Int. Cl.
 H03F 1/02 (2006.01)
 H03G 3/30 (2006.01)
 H03F 1/32 (2006.01)

(52) U.S. Cl.
 CPC ......... *H03F 1/0227* (2013.01); *H03F 1/3241* (2013.01); *H03G 3/3042* (2013.01); *H03F 2200/102* (2013.01); *H03F 2200/195* (2013.01); *H03F 2200/201* (2013.01); *H03F 2200/207* (2013.01)

(58) Field of Classification Search
 CPC ......... H03F 2200/102; H03F 2200/195; H03F 2200/201; H03F 2200/207; H03G 3/3042
 See application file for complete search history.

(56) References Cited

OTHER PUBLICATIONS

Mr. K. Sylvan, "Related GB Patent Application No. GB 1205744.4", "Search Report", dated Jul. 23, 2012, Publisher: UK IPO, Published in: GB.

H. Fritzsche, "Related International Patent Application No. PCT/EP2013/056666", "International Search Report and Written Opinion", dated Jul. 23, 2013, Publisher: PCT / ISA, Published in: EP.

Dongsu, Kim, et al., "Optimization for Envelope Shaped Operation of Envelope Tracking Power Amplifier", "IEEE Service Center, Piscataway, NJ; ISSN: 0018-9480; XP-11369961A", Jul. 1, 2011, pp. 1787-1795, vol. 59, No. 7, Publisher: IEEE Transactions of Microwave Theory and Techniques, Published in: US.

Gerard Wimpenny, "Understand and Characterize Envelope-Tracking Power Amplifiers", "EETimes; XP-002700045", Jan. 3, 2012, Page(s) figures 2,8, Publisher: UBM Electronics, Published in: URL: http://www.eetimes.com/document.asp?doc_id=1279313&page_number=1.

Yusoff, Z., et al., "Linearity Improvement in RF Power Amplifier System Using Integrated Auxiliary Envelope Tracking System", "IEEE MTT-S International, IEEE; ISBN: 978-1-61284--754-2; XP-32006716A", Jun. 5, 2011, pp. 1-4, Publisher: Microwave Symposium Digest (MTT).

\* cited by examiner

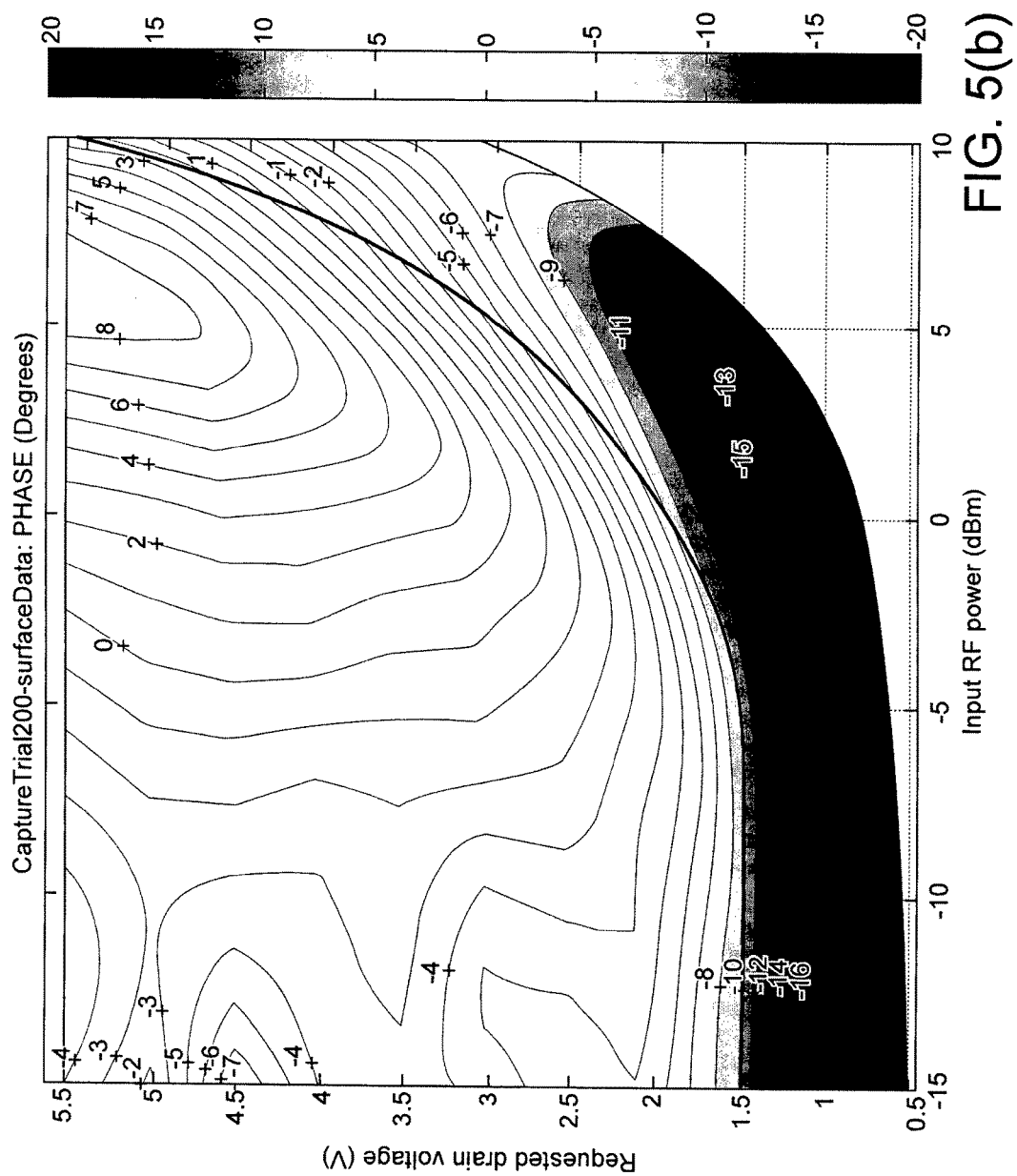

DYNAMIC CHARACTERISATION OF AMPLIFIER USING MULTIPLE ENVELOPE SHAPING FUNCTIONS

FIELD OF THE INVENTION

The invention relates to techniques for achieving efficient amplification of non-constant envelope signals. The invention particularly relates to the use of envelope tracking power supplies for amplification, incorporating shaping functions for shaping the envelope signal.

The invention particularly, but not exclusively, relates to the amplification of radio frequency (RF) signals.

DESCRIPTION OF THE RELATED ART

Many modern communication systems typically use non-constant envelope modulation techniques to achieve high spectral efficiency. To avoid spectral spreading into adjacent communication channels, high linearity radio frequency (RF) amplification is required. Traditional fixed bias amplifiers can only achieve the required linearity by 'backing off' the amplifier so that it normally operates at a power well below its peak power capability. Unfortunately, the DC to RF power conversion efficiency in this region is very low. As a consequence these designs dissipate considerable heat and reduce battery life when used in portable applications.

Maximisation of battery life is of paramount importance in mobile wireless equipment for example. With most high spectral efficiency communication standards, the mobile transmitter operates at considerably less than maximum power most of the time. There are two reasons for this. Firstly, power control is generally used to reduce the average transmit power to the minimum level required for reliable communication, and secondly most emerging modulation schemes have a high peak-to-average power ratio. Hence it is important for the power amplifier to maintain high efficiency at powers significantly below maximum, where the power amplifier operates most of the time.

A known technique for increasing amplifier efficiency, "envelope tracking" (ET), uses a supply modulator to modulate the supply voltage substantially in line with the envelope of the input RF signal. To achieve highest overall efficiency, the efficiency of the supply modulator itself must be high, requiring the use of a switched mode DC-DC converter within the modulator. The design of the supply modulator is critical to the system performance of the amplifier. In addition to achieving good efficiency, the modulator must also exhibit high bandwidth, high linearity and low noise to be useful in modern communications applications which typically use high bandwidth CDMA or OFDM modulation schemes and also demand high modulation accuracy.

An improved linearization approach uses a non-linear function to derive the amplifier supply voltage from the input signal envelope to achieve constant gain from the RF amplifier, thereby reducing the need for pre-distortion or feedback. The mapping function between the envelope voltage and supply voltage may use a continuous function, in which the supply voltage may be uniquely derived from knowledge of the envelope voltage.

In the prior art it is known to characterise a device, to generate a shaping function, by generating a continuous wave signal as an input to the amplifier. This results in the device getting hot, which can provide false characterisation data.

In an alternative arrangement, a pulse signal is used to overcome this problem associated with a continuous wave signal. However with a pulse wave signal a problem may arise in measuring phase characteristics.

It is thus an aim of the invention to provide an improved envelope tracking power amplifier characterisation method to improve the test process.

In known prior art devices, characterisation methods are used in envelope tracking architectures in order to control the signals in the envelope path in order to meet a system objective to improve a system characteristic, such as efficiency. This may be at the expense of accepting a reduced system performance associated with another system characteristic.

It would thus be advantageous to provide an improved envelope tracking power amplifier characterisation method and an improved method for utilising the parameters obtained during characterisation to improve system performance in use.

In known characterisation methods, obtaining an accurate estimate of the AM-PM distortion of an envelope tracking amplifier is a known problem, as a result of phase wander in the test system itself. Moreover this is a problem which is generally applicable to measuring test parameters for amplifiers in general, irrespective of whether they are part of an envelope tracking architecture.

It would thus be advantageous to provide an improved method for determining the AM-PM distortion of an amplifier.

SUMMARY OF THE INVENTION

In accordance with the invention there is provided a method of characterising an envelope tracking amplification stage comprising an amplifier for amplifying an input signal and an envelope tracking modulated power supply for generating a modulated supply voltage for the amplifier in dependence on the input signal envelope, and in which the input signal envelope to the envelope tracking modulated supply voltage is shaped by a shaping function, the method comprising: generating an input test waveform which is representative of an input waveform under normal operating conditions of the amplification stage; applying a respective one of a plurality of different shaping functions, each comprising a non-linear transfer function, to the input signal envelope in each of a plurality of test periods during the period in which the input test waveform is applied as the input signal to generate the input to the envelope tracking modulated supply voltage; measuring parameters of the amplification stage during the period in which the input test waveform is applied in order to allow determination of the gain, phase and efficiency characteristics of the amplifier; and for each of the gain, phase and efficiency characteristics, generating a three dimensional plot of the characteristic with respect to input power and supply voltage applied to the amplifier.

The invention further provides measurement system adapted to perform this method. The invention also provides a measurement system with means for performing this method.

In use under normal operating conditions of the amplification stage, at least one of the three dimensional plots of the gain, phase or efficiency characteristics may be used to determine a shaping function for the shaping table to meet a system gain, phase or efficiency objective.

The plurality of different shaping functions may comprise a family of functions which increase monotonically with respect to input signal level.

Each shaping function may be a parameterised algebraic function. The parameters of each algebraic function may be chosen to characterise the amplifier over a range of combinations of input power and supply voltage of operational interest.

The number of the plurality of shaping functions may be chosen to meet an objective for the resolution of the three dimensional plots.

The generation of each of the three dimensional plots may comprise data fitting the measured parameters. The data fitting may comprise determining the non-memory effects of the amplifier by solving a least squares polynomial fit to determine polynomial coefficients based on the measured parameters. Each test region with a different applied envelope shaping function may be treated independently. A non-memory model of the amplifier distortion may comprise:

$$y(n) = [x(n)|x(n)|^0 \ x(n)|x(n)|^1 \ \ldots \ x(n)|x(n)|^p] \begin{bmatrix} a_0 \\ a_1 \\ \ldots \\ a_p \end{bmatrix}$$

where y(n) denotes the current (complex baseband) output from the power amplifier as detected by a receiver; x(n) denotes the corresponding (time aligned, complex baseband) input sample to the power amplifier as detected by a receiver; and p is the polynomial order.

The data fitting may be extended to include memory effects. The non-memory model may be extended to include memory terms and memory coefficients.

Interpolating through any of the three dimensional plots may allow the gain, phase and efficiency response of the amplifier to be estimated along any arbitrary envelope shaping function.

A shaping function may be a function which maps each instantaneous value of the input signal envelope to an instantaneous supply voltage to the amplifier.

The step of applying a respective one of a plurality of different shaping functions during the period in which input test waveform is applied as the input signal may comprise applying a different shaping function in each successive test period.

The step of measuring parameters of the amplification stage during the period in which the input test waveform is applied in order to allow determination of the gain, phase and efficiency characteristics of the amplifier may comprise measuring: the instantaneous input power to the amplifier; the instantaneous output power from the amplifier; the instantaneous input phase at the input of the amplifier; the instantaneous output phase at the output of the amplifier; the instantaneous supply current to the amplifier; and the instantaneous supply voltage to the amplifier.

The invention further provides a measurement system adapted to perform the method steps. The invention also provides a measurement system with means for performing the method steps.

BRIEF DESCRIPTION OF THE FIGURES

The invention is now described by way of reference to the accompanying Figures, in which:

FIGS. 5(a) to 5(c) illustrate exemplary three dimensional surfaces generated as a result of the exemplary test/characterisation process.

DESCRIPTION OF THE PREFERRED EMBODIMENTS

The invention is now described by way of example with reference to exemplary arrangements. The invention is not limited to the details of any described arrangement unless expressly stated. Aspects of the exemplary arrangements may be implemented in different combinations, and the invention is not limited to a specific combination of features by virtue of the presentation of an exemplary combination for the purposes of explaining the invention.

Figure 1:
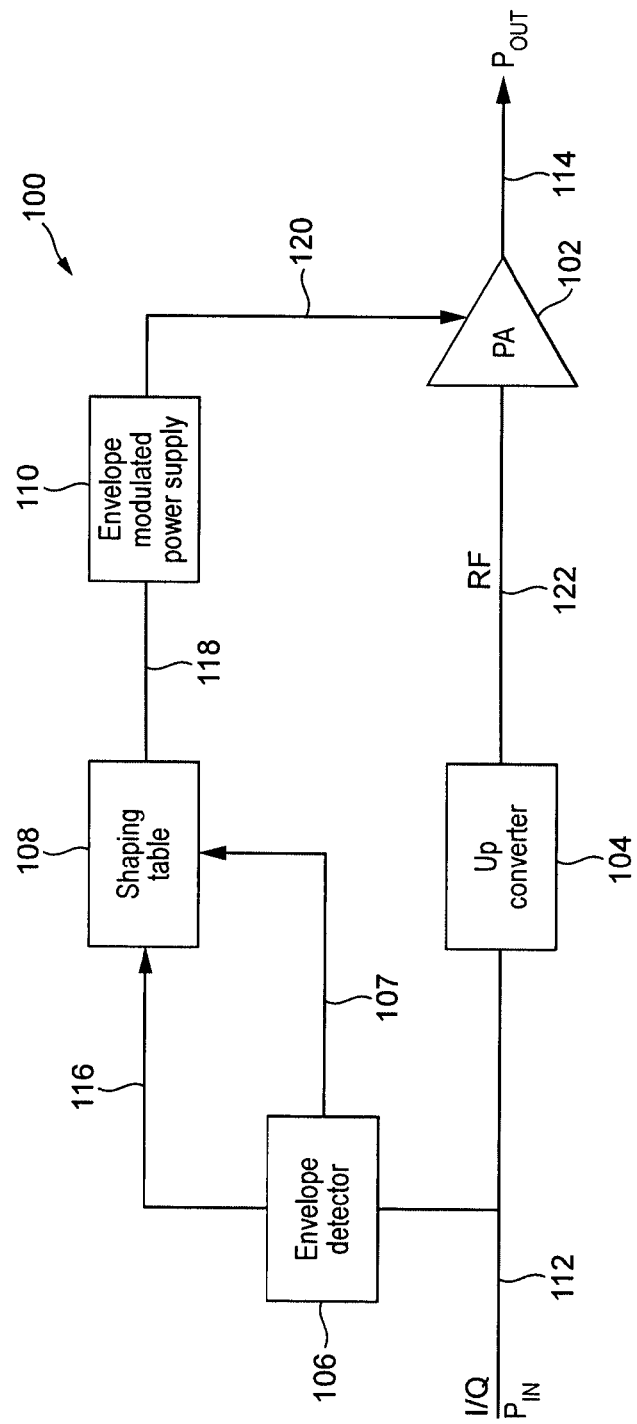
FIG. 1 illustrates an exemplary amplification system in which improvements in accordance with the invention and its embodiments may be implemented.

FIG. 1 illustrates an exemplary envelope tracking radio frequency (RF) power amplifier system 100 in which improvements in accordance with the present invention may be implemented. The envelope tracking power amplifier system 100 includes a power amplifier 102, an up-converter 104, an envelope detector 106, a shaping table 108, and an envelope modulated power supply 110.

A baseband input I/Q signal on line 112 forms an input to the up-converter 104, which generates an RF input signal for the RF power amplifier on line 122. The instantaneous power of the baseband input I/Q signal is denoted $P_{IN}$. The input I/Q signal on line 112 also forms an input to the envelope detector 106, which generates an envelope signal representing the envelope of the baseband input I/Q signal at its output on line 116. The envelope detector 106 additionally may generate, as illustrated in the arrangement of FIG. 1, a control signal on line 107 to the shaping table 108. In an alternative arrangement this control signal for the shaping table may be provided directly from baseband processing circuitry (not shown) from which the baseband I/Q signal is derived. The envelope signal on line 116 is provided as an input to the shaping table 108. The output of the shaping table on line 118 provides an input to the envelope modulated power supply, which in dependence thereon provides the supply voltage to the RF power amplifier on line 120. The RF power amplifier generates an amplified RF output signal at its output on line 114. The instantaneous power of the RF output signal is denoted $P_{OUT}$.

The up-converter 104 converts the baseband input I/Q signal on line 112 into an RF signal for amplification. The envelope detector receives the I/Q signal on line 112, and generates an envelope signal at its output which represents the envelope of the input signal, i.e. provides a signal representing the magnitude of the input signal.

The implementation of the envelope modulated power supply 110 is outside the scope of the present invention, and one skilled in the art will appreciate that it may be implemented in a number of ways. Typically the envelope modulated power supply 110 includes a switched voltage supply in which one of a plurality of supply voltages can be selected in dependence on the instantaneous magnitude of the envelope signal provided by the shaping table. In an efficient amplification scheme, the selected supply voltage may then be further adjusted to provide a more accurate representation of the instantaneous envelope signal, before being provided to the RF power amplifier as the supply voltage. The invention is not limited to any specific implementation of an envelope modulated power supply.

The power amplifier 102 may be implemented as a single stage or multi-stage amplifier.

The shaping table 108 applies a shaping function to the envelope signal on line 116 to provide a shaped envelope signal on line 118. A shaping function is a function which maps each instantaneous value of the input signal envelope to an instantaneous supply voltage to the amplifier. The shaping function applied is determined by a control signal received from the envelope detector on line 107. The control signal may determine which shaping function, amongst a plurality of shaping functions, is applied to the envelope signal. The control signal may simply be a signal representing the average power of the baseband I/Q input signal on line 112. The shaping of the envelope signal influences the efficiency and linearity of the power amplifier 102.

The power amplifier 102 is characterised in a pre-operation phase to determine the optimum instantaneous supply voltage level for a given baseband input (I/Q) signal level in order to meet particular system objectives. This allows an optimum shaping function to be determined and applied in the shaping table for a given input condition and system objective.

Figure 2:
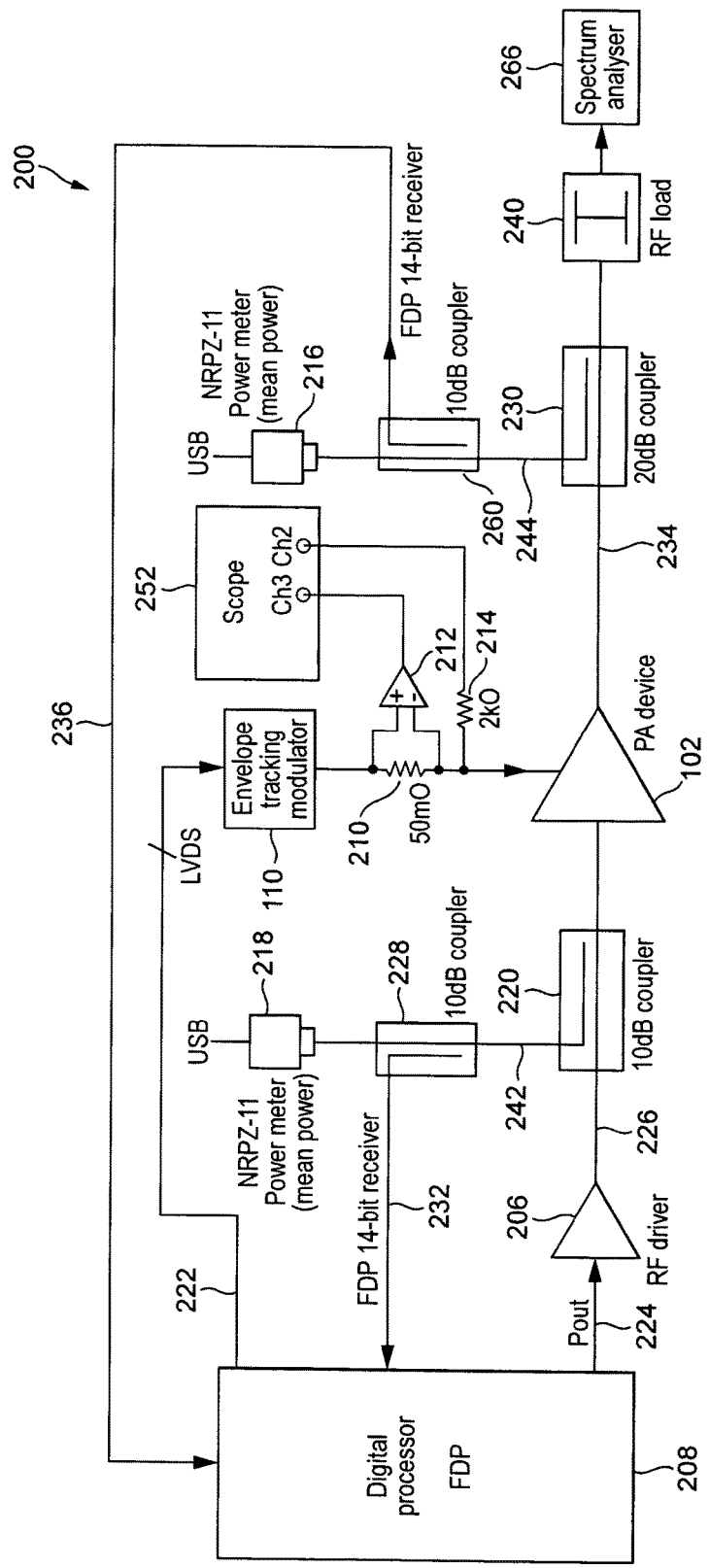
FIG. 2 illustrates an architecture of an exemplary test/characterisation system for characterising a power amplifier device.

A preferred technique for characterising the power amplifier 102 is now described, initially by describing an exemplary test architecture for the characterisation process as illustrated in FIG. 2.

The test architecture 200 includes a power amplifier device 102 to be characterised, and an envelope tracking modulator 110 for the power amplifier. The envelope tracking modulator 110 may preferably comprise a high efficiency envelope tracking modulator, however the invention is not limited to any specific implementation of an envelope tracking modulator. The architecture 200 thus includes the set-up of the amplifier and supply which is provided for normal envelope tracking operation.

The test architecture further includes a digital processor 208. The digital processor may comprise part of the digital baseband processing circuitry provided for normal operation of the amplifier.

The digital processor 208 generates an envelope signal on line 222 to the envelope modulator 110, and generates a test RF input signal for the amplifier on line 224.

An RF driver 206 amplifies the RF input signal on line 224 for delivery to the input of the amplifier 220. The RF amplifier amplifies the RF signal on its input, and generates an RF output signal on line 234.

A plurality of couplers 228, 220, 230 and 260 are provided for detecting the signal at various points in the test architecture.

The coupler 220 couples to the signal on line 226, and provides on a line 242 an indication of the level of the RF signal at the input to the amplifier. The coupler 228 provides on line 232 an indication of the signal on line 242. The line 242 is connected to a power meter 218. The line 232 is connected to the digital processor 208. The digital processor 208 includes a receiver for processing the signal received on line 232, and thus includes a receiver for processing the input signal to the power amplifier 102.

The coupler 230 couples to the signal on line 234, and provides on a line 244 an indication of the level of the signal at the output of the amplifier. The coupler 260 provides on line 236 an indication of the signal on line 244. The line 244 is connected to a power meter 216. The line 230 is connected to the digital processor 208. The digital processor 208 includes a receiver for processing the signal received on line 236, and thus includes a receiver for processing the output signal of the power amplifier 102.

A resistor 210 is connected between the output of the envelope tracking modulator 110 and a supply input of the power amplifier 102. A difference amplifier 212 has a pair of inputs connected to the respective terminals of the resistor 210, and an output connected to an oscilloscope 252. A resistor 214 is further connected between the supply input to the power amplifier 102 and a further input of the oscilloscope 252. The oscilloscope can thus take instantaneous current and voltage measurements at the supply terminal of the power amplifier 102.

An RF load 240 is connected to the output of the amplifier 102 on line 234, to emulate the load that that would be connected to the output of the power amplifier 102 in a practical implementation. A spectrum analyser 266 may be connected to the load 240 for measuring certain output characteristics.

During the characterisation process, the instantaneous RF input power of the power amplifier and the instantaneous RF output power of the power amplifier may be measured using dual ultra linear receivers of the digital processor 208, which receive representations of the respective input and output power measurements on lines 232 and 236 from the respective couplers 228/220 and 260/230.

Further during the characterisation process, the RF input power of the power amplifier and the RF output power of the power amplifier may be measured using the mean power meters 218 and 216 respectively, which receive representations of the respective input and output power measurements on lines 242 and 244 from the respective couplers 220 and 230.

The power consumption of the power amplifier device may be measured using oscilloscope 252, which records both instantaneous current and voltage.

The digital processor 208 has independent control of the envelope signal to the envelope tracking modulator 110 and the RF input to the power amplifier 102.

This characterisation of the amplification stage 100 may require multiple power sweeps of the amplification stage. This characterisation may include measurement of various power amplifier parameters, including supply voltage; bias voltage; RF gain; RF phase; supply current; RF input power; and RF output power.

In general, the parameters of the device are measured which are necessary to determine a particular performance characteristic or objective. If, for example, it is desired to optimise the gain of the amplification stage, then those parameters necessary to determine gain are measured for different input (envelope) signal and supply voltage combinations.

A measurement database for a given amplification stage may thus be established following a characterisation process. The resulting measurement database can be used to predict the operational system performance of the device, based on the instantaneous input and the choice of shaping function.

The characterisation of the amplifier stage is known in the art to be carried out in a number of ways. The present invention presents an advantageous technique for characterisation which offers improvements over the prior art.

The architecture of FIG. 2 allows the following characteristic of the power amplifier device to be measured:

1. Instantaneous output power;
2. Instantaneous input power;
3. Instantaneous output phase;
4. Instantaneous input phase;
5. Instantaneous supply current; and
6. Instantaneous supply voltage.

The instantaneous input and output power measurements are used to compute AM-AM distortion. The AM-AM distortion of the amplifier represents a shift in the relative amplitudes of amplifier input and output signals, and may also be referred to as gain distortion. The instantaneous input and output phase measurements are used to compute AM-PM distortion. The AM-PM distortion of the amplifier represents a shift in phase delay of a signal between the input and the output of the amplifier, and may also be referred to as a phase distortion. The instantaneous supply current and supply voltage are used to compute drain/collector efficiency of the amplifier.

The architecture provides all the "quasi-static" (or memory-less) information for power amplifier device modelling. The architecture also captures the information necessary to generate power amplifier memory models.

The detection of average input and output powers using the power meters 218 and 216 allows for calibration of the measurement receivers to ensure the absolute accuracy of power measurements.

In accordance with an exemplary arrangement, during a test or characterisation operation the input signal for the amplifier is provided by the digital processor as a signal waveform sample which is similar to a real transmission signal. The actual generation of such a signal is outside the scope of the present invention, and it may be generated in a number of different ways.

An advantage of using a real transmission signal is that the characterisation of the power amplifier occurs under representative operating conditions and includes thermal effects. The power amplifier is driven over a range of signals approximating the real operational conditions, and thermal effects on the power amplifier can therefore be taken into account in the characterisation process. This ensures that the thermal loading of the power amplifier during testing/characterisation is representative of that of the power amplifier in normal use.

In an exemplary arrangement, the input waveform used in the characterisation process is 10 ms in length.

The test architecture of FIG. 2 permits various characteristics of the power amplifier 102 to be determined. For example, the instantaneous AM-PM distortion, the instantaneous AM-AM distortion, and the instantaneous efficiency characteristics may be determined. These characteristics may be rapidly determined as a function of instantaneous input power and instantaneous supply voltage.

In the prior art, a difficulty arises in determining AM-PM distortion of the power amplifier. Due to 'phase wander' in the test architecture over time, the signals measured at the input and output of the power amplifier cannot be reliably used to measure the AM-PM distortion of the amplifier, as the phase error caused by phase wander is unknown. The phase wander refers to a slowly changing (relative to the test signal modulation) variation in the phase at points in the test architecture due to low frequency phase noise of the transmitter and receiver local oscillators of the measurement system. For example where separate receivers are used to receive the input and output signals to the power amplifier, as illustrated in the exemplary test architecture of FIG. 2, the two receivers may exhibit different phase wander over time, such that a phase distortion contribution arises solely from a phase error between the receivers, rather than a AM-PM distortion in the power amplifier. The amount and effect of the phase wander will depend upon the test architecture, but would be particularly evident if separate receivers are used for the input and output of the power amplifier which are driven from separate local oscillators.

Figure 3:
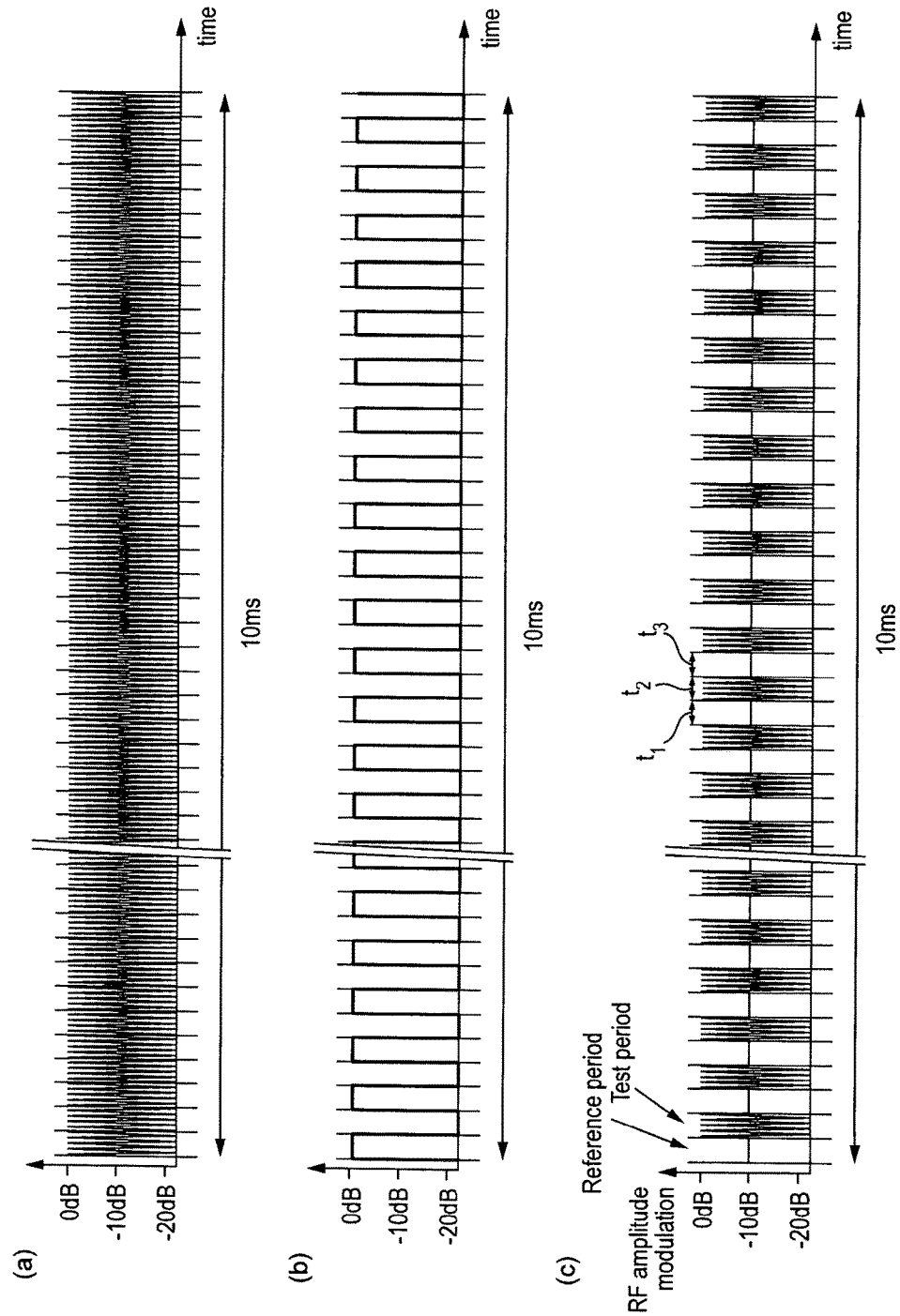
FIGS. 3(a) to 3(c) illustrate the generation of test/characterisation waveforms in a preferred arrangement.

In accordance with a preferred arrangement, an adaptation is made to the control of the test architecture of FIG. 2, as described with reference to FIG. 3, to enable the AM-PM distortion of the power amplifier to be accurately determined.

FIG. 3(a) illustrates an exemplary 10 ms test waveform to be provided as an input to the RF driver 206 of FIG. 2 for the purpose of characterising the power amplifier 206. The envelope signal for the envelope tracking modulator 110 is additionally generated based on this test waveform. As discussed above, the test waveform of FIG. 3(a) represents a portion of a real signal which would be input to the power amplifier in use.

In order to allow for an accurate determination of phase distortion, the test waveform of FIG. 3(a) is punctured using a puncture pattern as shown in FIG. 3(b), to produce a modified test waveform containing periods of constant voltage as shown in FIG. 3(c).

As can be seen in FIG. 3(b), the puncture pattern divides the time period of the test waveform into a series of sub-periods of equal length. Each alternate sub-period is a puncture period. The other alternate sub-periods are signal periods, in which the waveform is not punctured. Although in the described example the sub-periods are of equal length, in alternative implementations the sub-periods may be of different lengths.

The resulting waveform as shown in FIG. 3(c) provides sub-periods which alternate between the presence of the actual waveform signal, which are referred to as test periods, and periods of constant voltage, which are referred to as reference periods. In each test period an input signal is provided which is representative of a real transmission signal as discussed above. In each reference period a continuous wave RF signal may be provided as an input, having a constant amplitude and a constant phase.

In the test periods, when portions of the actual waveform are applied to the power amplifier, characterisation of the power amplifier 102 takes place, which preferably includes the acquisition of measurements which allow the AM-PM distortion of the power amplifier to be determined.

In the reference periods, during which the voltage is constant, information is acquired to determine the portion of the detected AM-PM distortion which is attributable to phase wander in the test architecture. This allows removal of the portion of the phase adjustment attributable to phase wander from the phase measurements taken in the test period.

With reference to FIG. 3(c), three successive time periods $t_1$, $t_2$, $t_3$ are denoted. Time period $t_1$ denotes a reference period, time period $t_2$ denotes a following test period, and time period $t_3$ denotes a following reference period. In time period $t_2$ measurements are taken during the test period which allows the AM-PM distortion of the power amplifier to be determined. In preceding time period $t_1$ measurements are also taken, while the supply voltage is constant, to measure the amplifier phase shift during time period $t_1$. Similarly in time period time period $t_3$ measurements are also taken, with the same fixed supply voltage, to measure the amplifier phase shift in time period $t_3$. The test periods are preferably made short enough such that any phase wander over a test period can be approximated as a linear function of time. Alternatively, more sophisticated interpolation techniques can be used to estimate the phase error during time period $t_2$. The difference in measured phase between the end of time period $t_1$ and the start of time period $t_3$ represents the phase wander during time period $t_2$. The estimated phase error during time period $t_2$ can be removed from the AM-PM distortion measurement made in time period $t_2$, to provide a corrected measurement of AM-PM distortion for time period $t_2$ which represents an estimate of the true AM-PM distortion of the amplifier.

More particularly, linear interpolation or more sophisticated interpolation techniques can be used to estimate the phase error in the measurement system during time period $t_2$.

Thus an arrangement as described preferably provides a method of determining an AM-PM distortion measurement for an amplifier, the method comprising: generating a test waveform to be provided to the input of the amplifier; periodically puncturing the test waveform with a fixed-level reference signal to generate a modified test waveform which alternates between test periods in which a portion of the test waveform is present and reference periods in which the fixed-level reference signal is present; measuring the amplifier AM-PM distortion in a test period; measuring the phase difference between the input and the output of the amplifier in reference periods either side of the test period; estimating a phase error in the test period in dependence on phase differences measured in the reference periods; and estimating the true amplifier AM-PM distortion by removing the estimated phase error from the measured amplifier AM-PM distortion.

This method is described herein with reference to an implementation associated with characterisation of an envelope tracking amplifier, and the control of an envelope tracking amplifier. However the described technique is more generally applicable, and may be used to determine an AM-PM distortion measurement for any amplifier.

The punctured reference periods in the RF baseband test waveform for driving the power amplifier under test are preferably used to allow for phase wander compensation, with test periods between these reference periods allowing for testing/characterisation of the power amplifier In practice, a small guard period may be inserted between the reference and test period to smooth transitions between the two regions. This may be achieved by smoothing the puncture windows of FIG. 3(b).

In the characterisation of the device, a different predetermined envelope tracking shaping function is preferably applied in each test period. Each shaping function represents a non-linear transfer function.

Figure 4:
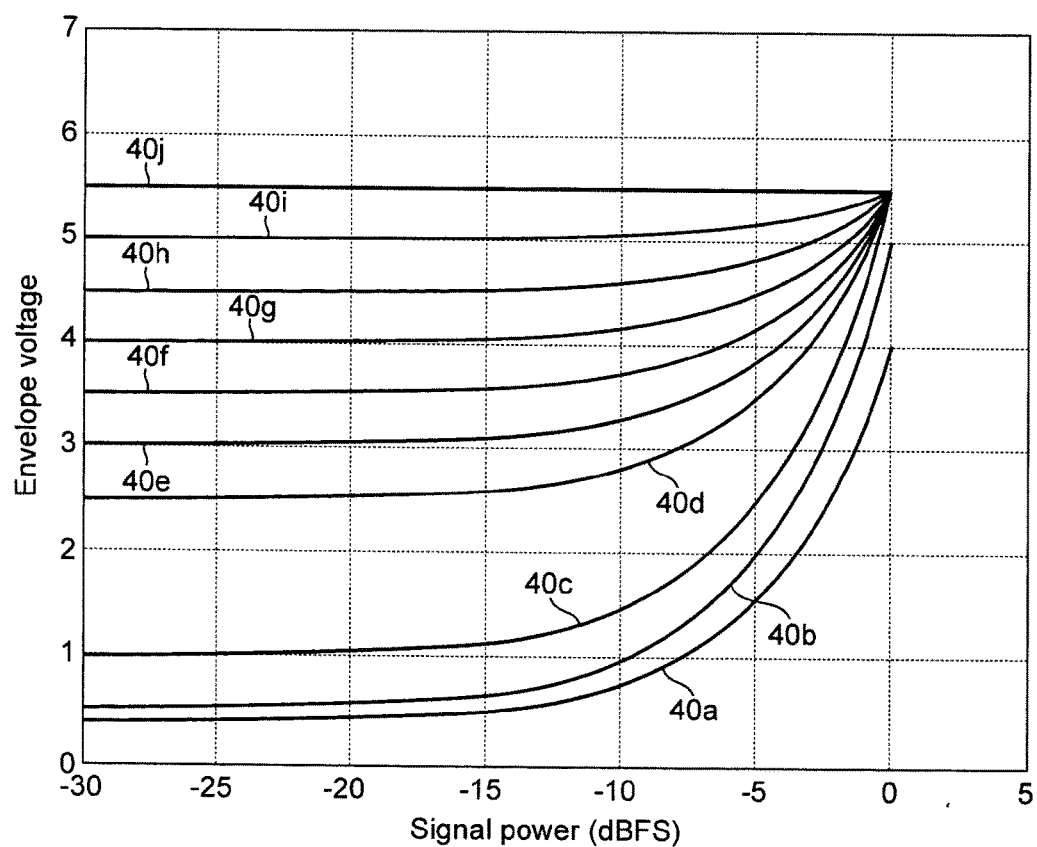
FIG. 4 illustrates exemplary shaping functions for a test/characterisation operation.

An example of such a set of shaping functions is illustrated in FIG. 4. FIG. 4 illustrates a set of shaping functions 40a to 40j. As can be seen, each shaping function allows an envelope voltage to be defined for an input signal power level. Thus the envelope voltage applied to the envelope tracking modulator in dependence on an instantaneous input signal is determined by the selected shaping function.

The plurality of different shaping functions may comprise a family of functions which increase monotonically with respect to input signal level.

Each shaping function may be a parameterised algebraic function. The parameters of each algebraic function may be chosen to characterise the amplifier over a range of combinations of input power and supply voltage of operational interest. The lowest and highest shaping functions determine the range of the characterisation process.

The number of the plurality of shaping functions is preferably chosen to meet an objective for the resolution of the three dimensional plots. The larger the number of shaping functions used in the characterisation process, the higher the resolution of the characterisation process.

The shaping function 40a represents the lowest shaping function of the set, and the shaping function 40j represents the highest shaping function of the set. The set of shaping functions of FIG. 4 are used in a preferred characterisation process. Other shaping functions may be used, and in particular a set of fixed voltages may be used (which would be represented in FIG. 4 by a series of horizontal lines). However the preferred shaping functions of FIG. 4 provide for a more advantageous characterisation process which is representative of normal operation conditions.

The shaping functions of FIG. 4 are algebraic functions with a parameterised swing range. As can be seen each shaping function starts a different initial voltage and has a different degree of aggression: in this context, aggression relates to the variation between the lowest voltage and highest voltage of the function: the shaping function 40j is non-aggressive, while the shaping function 40a is the most aggressive, applying the lowest possible voltage for a given output.

Thus, in the described example, the instantaneous input signal to the power amplifier is dependent upon the test waveform as illustrated in FIG. 3(c). The instantaneous supply voltage to the waveform is dependent upon the envelope signal based on the test waveform, after shaping by the current shaping function applied in the shaping table, according to one of the waveforms of FIG. 4.

In summary, in order to accurately determine the phase distortion of the power amplifier, the power amplifier under test is driven with a waveform preferably consisting of:

1. Reference periods which allow phase wander compensation within the test periods;
2. Test periods with different envelope shaping functions applied, to exercise the power amplifier under test over a large range of instantaneous supply voltages for a given instantaneous input power. The test stimuli (i.e. the input waveform) are chosen to be representative of the statistics of the final application waveforms of the target system (i.e. to replicate a real signal); and
3. Guard periods, to allow smooth transitions between the reference and test regions.

It should be noted that this process is required only when it is desirable to accurately determine the AM-PM distortion. The described techniques can still be advantageously used, without puncturing the test waveform, if such an accurate determination of AM-PM distortion is not required. In such case the test waveform is simply divided into sub-periods, a different envelope shaping function is applied line ach test period. The test waveform is continuous, with no reference periods in such case.

Thus in an arrangement there is provided a method of characterising an envelope tracking amplification stage comprising an amplifier for amplifying an input signal and an envelope tracking modulated power supply for generating a modulated supply voltage for the amplifier in dependence on the input signal envelope, and in which the input signal envelope to the envelope tracking modulated supply voltage is shaped by a shaping function, the method comprising: generating a input test waveform which is representative of an input waveform under normal operating conditions of the amplification stage; applying a respective one of a plurality of different shaping functions, each comprising a non-linear transfer function, to the input signal envelope in each of a plurality of test periods during the period in which the input test waveform is applied as the input signal; measuring parameters of the amplification stage during the period in which the input test waveform is applied in order to allow determination of the gain, phase and efficiency characteristics of the amplifier; and for each of the gain, phase and efficiency characteristics, generating a three dimensional plot of the characteristic with respect to input power and supply voltage applied to the amplifier.

Thus in general, in one arrangement there is provide a technique for estimating the AM-PM distortion of an amplifier, and in another technique there is provided an advantageous technique for characterising an envelope tracking amplifier using a set of shaping functions. The two techniques may advantageously be combined, but can be implemented separately to achieve advantages independently.

During the test or characterisation operation in the preferred arrangement, the following four measurements are preferably synchronously recorded using the test equipment:
1. The instantaneous RF input voltage to the power amplifier;
2. The instantaneous RF output voltage from the power amplifier;
3. The instantaneous supply voltage to the power amplifier (from an oscilloscope); and
4. The instantaneous supply current to the power amplifier (from an oscilloscope).

Following the capturing of these measurements there may be compiled four 'raw' waveforms, one for each of the above measurements, during the test or characterisation operation. Thereafter, the four 'raw' waveforms are processed in a post-processing sequence.

A measurement database for a given amplification stage may thus be established following a characterisation process. Such measurement database forms the basis for determining the contents of the shaping table 108 of FIG. 1. The measurement database can be queried to determine key aspects of device performance.

In the post-processing operation, the four 'raw' waveforms are first aligned in time and resampled to the same sample rate.

Then phase wander compensation is performed on both the power amplifier input and power amplifier output receive channels, based on phase measurements in the reference periods and compensation during the test periods as discussed hereinabove.

The raw data of the 'test periods' from the four waveforms is then stripped out.

Next, data fitting to the raw data of the test periods is then performed.

Data fitting to the raw data in the test periods may be considered as directly analogous to non-memory pre-distortion. The non-memory effects of the power amplifier may be determined by solving a least squares polynomial fit to determine polynomial coefficients based on the input and output data during the test regions. Each test region (with a different applied envelope shaping function) is treated independently. A non-memory model of the power amplifier distortion is used of the form:

$$y(n) = [x(n)|x(n)|^0 \quad x(n)|x(n)|^1 \quad \ldots \quad x(n)|x(n)|^P] \begin{bmatrix} a_0 \\ a_1 \\ \ldots \\ a_p \end{bmatrix}$$

where y(n) denotes the current (complex baseband) output from the power amplifier as detected by a receiver; x(n) denotes the corresponding (time aligned, complex baseband) input sample to the power amplifier as detected by a receiver; and p is the polynomial order.

Least squares optimisation is performed to determine the coefficients $[a_0, a_1, \ldots a_p]^T$, given the full set of measurement samples within the test period.

Data fitting within the test periods can optionally be extended to include memory effects, by adding in memory terms and memory coefficients into the above least squares data fit expression. This will give a more accurate model of the power amplifier distortion (including memory effects), and hence allow for more accurate predictions of the response of the power amplifier.

Alternative data-fitting techniques will be known to one skilled in the art, the above-described technique being a preferred technique.

The data fitting techniques are preferably applied independently to each test region in which a different envelope shaping function is applied.

After performing data fitting within the test regions, in accordance with a preferred implementation smooth three-dimensional surfaces can then be plotted showing:
1. Instantaneous gain versus input power and supply voltage;
2. Instantaneous phase versus input power and supply voltage; and
3. Instantaneous efficiency versus input power and supply voltage.

Interpolation through any of the three dimensional surfaces then allows the gain, phase and efficiency response of the power amplifier to be estimated along any arbitrary envelope shaping function. Alternatively, criteria can be set as a basis for determining an envelope shaping function from these measurements, for example maintaining constant gain as a function of instantaneous input power.

Figure 5A:
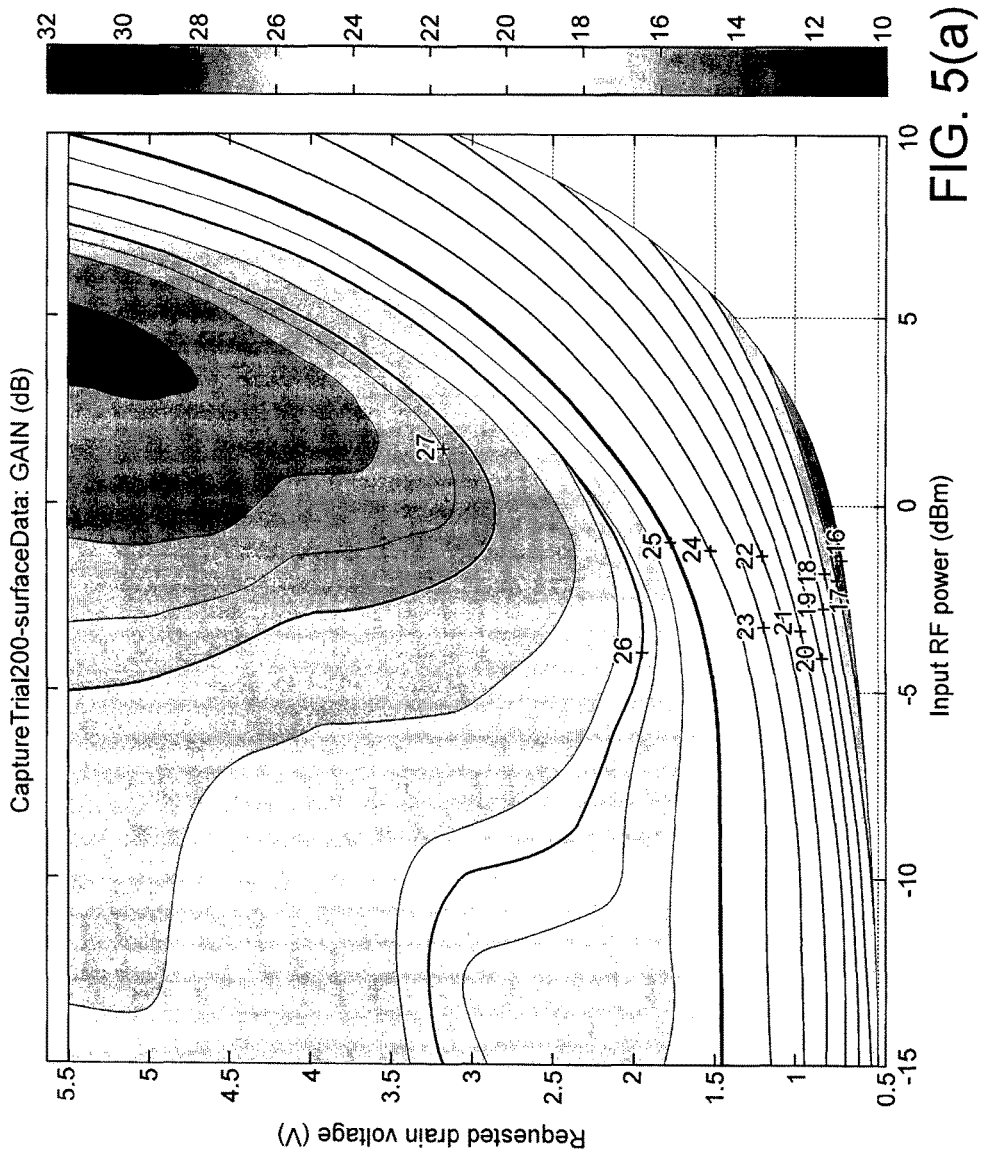

FIG. 5(a) illustrates an example surface obtained by this process. The plot of FIG. 5 (which is a three dimensional surface plot) is a plot of power amplifier gain as a function of input power and supplied voltage. As can be seen, the illustrated axes are input power and drain voltage, and the contours of the lines of the plot are contours of the amplifier gain. A shaping function which follows any of the contours will give a constant gain. The dark line illustrates constant gain as 25 dB.

FIG. 5(b) illustrates a similar plot for power amplifier phase response as a function of input power and supplied voltage. The dark line illustrates the phase response associated with constant gain at 25 dB, showing the phase variation following selection of the constant gain in FIG. 5(a).

Figure 5C:
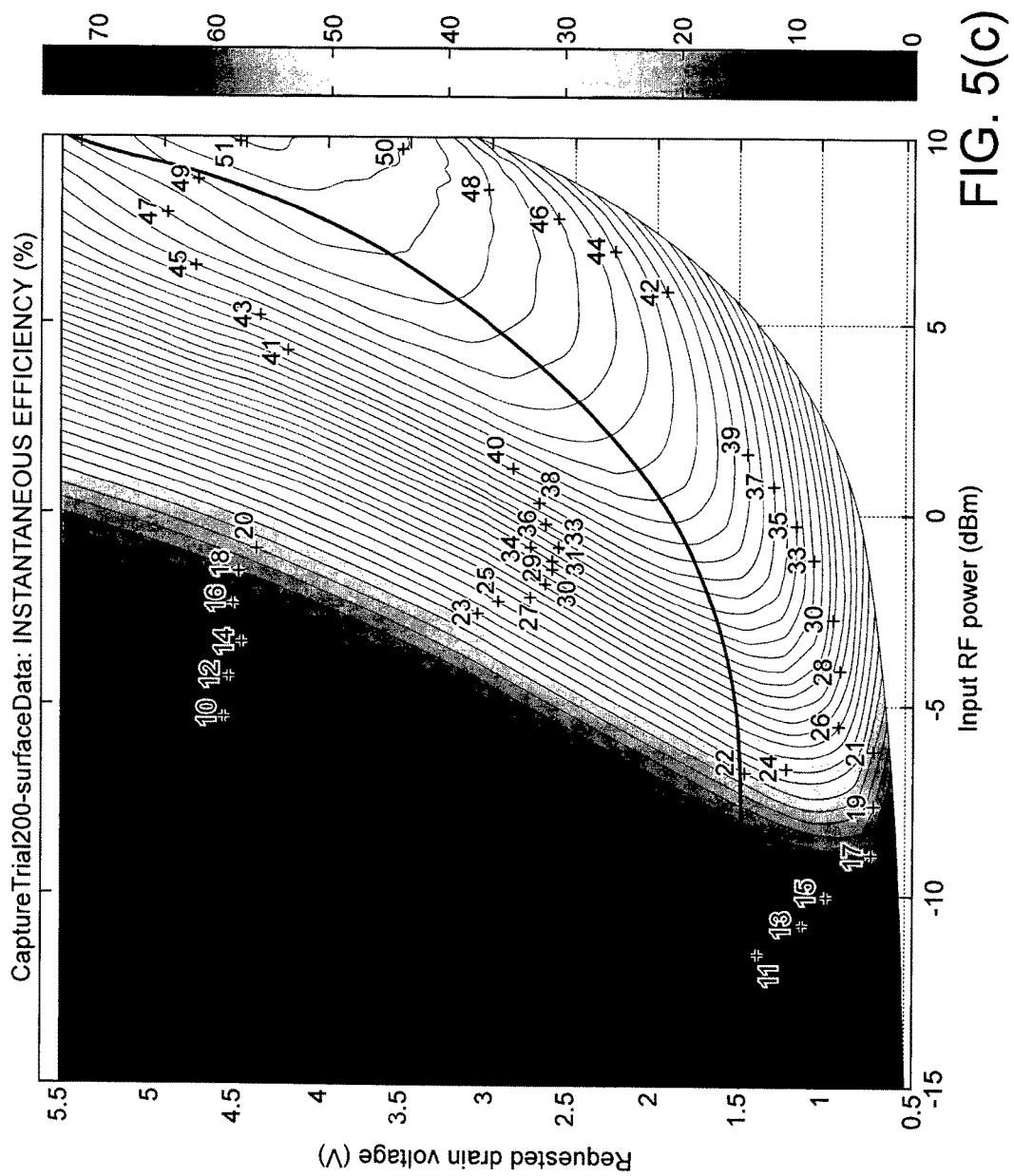

FIG. 5(c) illustrates a similar plot for power amplifier efficiency as a function of input power and supplied voltage. The dark line shows the efficiency response associated with constant gain at 25 dB, showing the phase variation following selection of the constant gain in FIG. 5(a). This allows an assessment to be made as to how close operation is to maximum efficiency.

It can be seen that the characterisation of the power amplifier thus allows three dimensional surfaces to be created which show the response of the power amplifier to any arbitrary envelope shaping function for a given system characteristic (such as gain, phase or efficiency). In the preferred arrangement the phase, gain and efficiency responses are measured to provide three three-dimensional surfaces. Each three-dimensional surface comprises a plot for the given system characteristic (gain, phase, efficiency) against input power and supply voltage to the amplifier.

In accordance with a preferred arrangement, the shaping function can be chosen to satisfy some particular criteria, such as maximum efficiency from the power amplifier. The gain and/or phase surfaces may then be used to determine the residual gain and/or phase error resulting from that chosen shaping function to maximise efficiency. This can be understood from FIGS. 5(a) to 5(c) above, where FIG. 5(a) shows the selection of a shaping function to meet a constant gain response, and FIGS. 5(b) and 5(c) show how applying that shaping function in the shaping table will impact on the phase and efficiency response of the power amplifier.

Based on knowledge of the residual errors once a system objective is achieved with selection of the shaping function, in accordance with a preferred arrangement a pre-distortion block in the RF signal input path can be adjusted to compensate for PM and/or AM residual errors over some or all of the power range of the RF signal.

Figure 6:
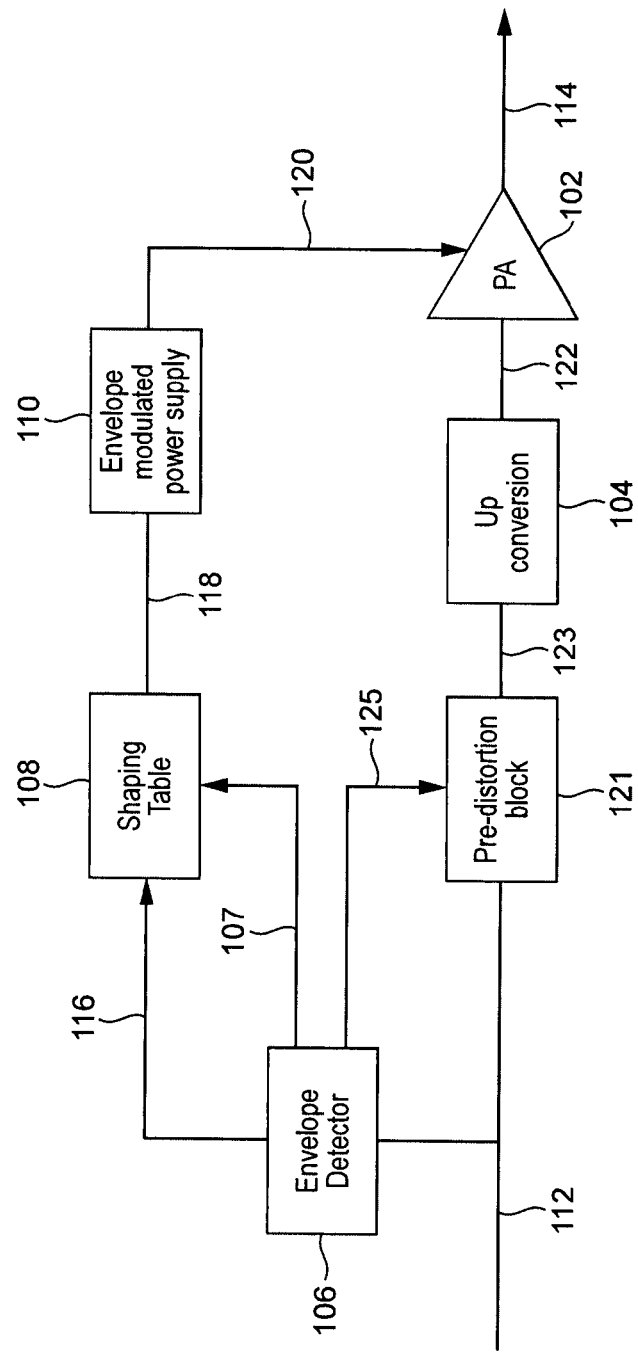
FIG. 6 illustrates an improved amplification system in accordance with a preferred arrangement.

FIG. 6 illustrates a modification to the amplifier arrangement of FIG. 1 to allow for this preferred arrangement. As can be seen in FIG. 6, a pre-distortion block is provided in the RF input path, to receive the input I/Q signals on line 112 and to generate an output signal on line 123 which provides an input to the up-conversion block 104. The envelope detector 106 generates an additional control signal 125 which controls the pre-distortion block 121. The control signal on line 125 may be representative of the average power of the input signal on line 112. In an alternative arrangement, this control signal on line 125 for the pre-distortion block may be provided directly from baseband processing circuitry (not shown).

Thus in a general arrangement there is provided a method of controlling an envelope tracking amplification stage comprising an amplifier for amplifying an input signal, an envelope tracking modulated power supply for generating a modulated supply voltage for the amplifier in dependence on the input signal envelope, and in which the input signal envelope to the envelope tracking modulated supply voltage is shaped by a shaping function, and a pre-distortion block for pre-distorting the input signal to the amplifier, the method comprising: in a characterisation mode of the amplifier under test conditions: measuring parameters of the amplification stage to determine at least two of gain, phase and efficiency characteristics for instantaneous values of input power and supply voltage of the amplifier; and for each of the at least two of gain, phase and efficiency characteristics, generating a three-dimensional plot representing the characteristic with respect to input power and supply voltage applied to the amplifier, and in a use mode of the amplifier under normal operating conditions: using at least one of the three-dimensional plots to determine a shaping function for the shaping table in dependence on a primary system objective associated with one or more of gain, phase or efficiency; and using the determined shaping function and at least one of the three dimensional plots to determine the pre-distortion coefficients for the pre-distortion block to meet a secondary system objective associated with at least one of gain, phase or efficiency.

In the arrangement of FIG. 6, the shaping function in the shaping table 108 can be selected from one or more of the phase, gain and efficiency plots of FIGS. 5(a) to 5(c) in order to meet a primary system objective associated with one of those plots. For example, the shaping function may be selected from the efficiency plot, in order to meet an efficiency objective. Once the shaping function is selected, then pre-distortion coefficients for the pre-distortion block 121 can be determined from the phase and gain plots in order to meet a secondary system objective. Where the primary system objective is an efficiency objective, the secondary system objective may be a gain and/or phase objective.

As noted above, when the shaping function is selected to achieve an efficiency objective, for example, the effect of this on the gain and/or phase performance can be determined by tracking that shaping function in the phase and/or gain three-dimensional surface plots. This can then be used to determine the difference or error between the actual phase or gain response associated with meeting the first system objective, and the desired phase or gain response associated with the second system objective. The resulting difference or error arising with respect to the second system objective can then be cancelled, or at least mitigated to some extent, by making an appropriate adjustment in the coefficients of the pre-distortion block 121. The residual gain and/or phase errors (or differences in comparison to a secondary system objective) can form inputs to look-up tables of the pre-distortion block.

The contents of these look-up-tables may be switched based on the chosen envelope shaping table (since the residual gain and phase errors will also change based on chosen envelope shaping functions).

This may allow, for example, for a constant phase to be achieved by applying in the pre-distortion block a phase function which is inverse to the phase function resulting from the selection of the shaping function. For example, a secondary system objective may be constant gain, but in fulfilling a first system objective associated with efficiency it can be determined from the three-dimensional gain surface that as a result gain will not be constant. A function which inverts the effect on gain of meeting the primary system objective may be applied in the pre-distortion block if the amplifier is operated in mild compression.

It should be understood, however, that the above example of a secondary system target of a constant gain is only one example. Any gain objective (or any other objective such as a phase objective) may be required as a secondary system response. An appropriate adjustment can preferably be made in the pre-distortion block to compensate as desired according to an implementation. For example, alternatively it may be an objective to correct the phase over the entire RF signal range, but to only correct the amplitude in the low power range (i.e the range of operation where the amplifier is not in saturation).

By way of further example, reference is made to a further modification. The shaping function may be determined to meet a primary system objective, as described above (for example an efficiency objective), in such a way as to reduce the crest factor of the RF output signal as a means of achieving a further improvement in amplifier efficiency. Crest factor reduction is an example of such a modification, but in other implementations some other adaptation to the shaping function selected to meet the desired primary system objective may be required. In such case, the pre-distortion block 106 is not intended to remedy or inverse the effect resulting from the deliberate modification to the shaping function. In the example given, a controlled amount of AM distortion at high signal powers is deliberately introduced in order to reduce the Crest Factor of the RF output, and the pre-distortion block should not remove this AM distortion. The pre-distortion block will be arranged to make an appropriate adaptation to meet a secondary system objective, whilst maintaining the effect of any additional modification intentionally made to the selected shaping function.

The pre-distortion block 106 can only be used to correct for AM-AM distortion (i.e. gain distortion) at low power, i.e. when the amplifier is not heavily compressed. The pre-distortion block can be used to correct phase over all power ranges, i.e. whether the amplifier is in compression or not. In general, it would generally be desirable to correct phase over the whole power range, whereas gain would only be corrected when the amplifier is not in compression.

Some specific examples associated with the secondary objective are now defined. The secondary objective may be a linearity objective to minimise the AM-AM and AM-PM distortion of the amplifier. The secondary objective may be a linearity objective to minimise at least one of the AM-AM and AM-PM distortion of the amplifier over at least part of the range of input values. The secondary objective may be a linearity objective to linearise AM-PM distortion of the amplifier over the entire range of input values. The secondary objective may be a linearity objective to linearise AM-PM distortion of the amplifier over the entire range of input values, and to linearise AM-PM distortion at low input power levels.

In the foregoing it is discussed that the pre-distortion coefficients in the pre-distortion block are adjusted. In a practical implementation, the pre-distortion block may be a look-up-table (LUT) based entity, with at least one complex LUT (or gain and phase) as a function of input power, i.e. directly analogous to the gain and phase surfaces as described above.

The LUT is preferably derived from coefficients that are extracted from the non-memory polynomial fit during surface extraction as described above. Thus reference to adjusting the coefficients in the pre-distortion block can be understood as incorporating adjusting the values in the LUTs in the pre-distortion block.

Thus adjusting the pre-distortion blocks in the pre-distortion block may comprise adjusting the pre-distortion LUTs in the pre-distortion block, in an exemplary implementation. The use of the envelope tracking architecture incorporating the power amplifier and envelope tracking modulator, in combination with the baseband digital processor, allows the mode of the architecture to be switched between a characterisation or test mode and an operational mode.

The preferred arrangements in accordance with the invention have particular applicability, and offer particular improvements, in handset applications in comparison to prior art arrangements, since it is a fast characterisation technique which is representative of the condition the handset will operate in.

The invention and its embodiments and arrangements has applicability in general for any amplification stage incorporating an envelope tracking modulated power supply. Example implementations include mobile communications systems, both in wireless handsets and in wireless infrastructure.

The methods described herein may be embodied in computer software, such as a computer program comprising computer program code, which when executed on a computer causes a processor or processing elements associated with the computer to operate in accordance with the described methods. Such a computer program may be stored on a computer program product, such as a disc or other memory device.

Whilst the invention has been described with relation to particular arrangements, the invention is not limited to any specific combination of features or any specific feature unless defined as such by the appended claims. One skilled in the art will appreciate variations and modifications in the described arrangements which will fall within the scope of the defined invention.

The invention claimed is:

1. A method of characterizing an envelope tracking amplification stage comprising an amplifier for amplifying an input signal and an envelope tracking modulated power supply for generating a modulated supply voltage for the amplifier in dependence on an envelope of the input signal, wherein the envelope of the input signal supplied to the envelope tracking modulated power supply is shaped by a shaping function, the method comprising:
    generating an input test waveform which is representative of an input waveform under normal operating conditions of the amplification stage;
    applying a respective one of a plurality of different shaping functions, each comprising a non-linear transfer function, to the envelope of the input signal in each of a plurality of test periods during a period in which the input test waveform is applied as the input signal to generate an input to the envelope tracking modulated power supply;
    measuring parameters of the amplification stage during the period in which the input test waveform is applied in order to allow determination of gain, phase, and efficiency characteristics of the amplifier; and
    for each of the gain, phase, and efficiency characteristics, generating a three-dimensional plot of the characteristic with respect to an input power and the modulated supply voltage applied to the amplifier.

2. The method according to claim 1, wherein, in use under normal operating conditions of the amplification stage, at least one of the three-dimensional plots of the gain, phase, or efficiency characteristics is used to determine one of the plurality of different shaping functions to use for a shaping table to meet a system gain, phase, or efficiency objective.

3. The method of claim 2, wherein interpolating through any of the three-dimensional plots allows the gain, phase, and efficiency characteristics of the amplifier to be estimated along any arbitrary envelope shaping function.

4. The method of claim 1, wherein the plurality of different shaping functions comprises a family of functions which increase monotonically with respect to input signal level.

5. The method of claim 4, wherein each shaping function is a parameterized algebraic function.

6. The method of claim 5, wherein parameters of each of the parameterized algebraic function are chosen to characterize the amplifier over a range of combinations of input power and modulated supply of operational interest.

7. The method of claim 1, wherein a number of the plurality of shaping functions is chosen to meet an objective for a resolution of the three-dimensional plots.

8. The method of claim 1, wherein the shaping function is a function which maps each instantaneous value of the envelope of the input signal to an instantaneous supply to the amplifier.

9. The method of claim 1, wherein applying the respective one of the plurality of different shaping functions during the period in which the input test waveform is applied as the input signal comprises:
    applying a different shaping function in each successive test period.

10. The method of claim 1, wherein measuring the parameters of the amplification stage during the period in which the input test waveform is applied in order to allow determination of the gain, phase, and efficiency characteristics of the amplifier comprises measuring:
an instantaneous input power to the amplifier, an instantaneous output power from the amplifier, an instantaneous input phase at an input of the amplifier, an instantaneous output phase at an output of the amplifier, an instantaneous supply current to the amplifier, and an instantaneous supply voltage to the amplifier.

11. A computer program including computer program code adapted, when run on a computer system, to perform the method of claim 1.

12. A computer program product for storing computer program code which, when run on a computer system, performs the method of claim 1.

13. A measurement system for characterizing an envelope tracking amplification stage comprising an amplifier for amplifying an input signal and an envelope tracking modulated power supply for generating a modulated supply voltage for the amplifier in dependence on an envelope of the input signal, wherein the envelope of the input signal supplied to the envelope tracking modulated power supply is shaped by a shaping function, the measurement system being adapted to:
generate an input test waveform which is representative of an input waveform under normal operating conditions of the amplification stage;
apply a respective one of a plurality of different shaping functions, each comprising a non-linear transfer function, to the envelope of the input signal in each of a plurality of test periods during a period in which the input test waveform is applied as the input signal;
measure parameters of the amplification stage during the period in which the input test waveform is applied in order to allow determination of gain, phase, and efficiency characteristics of the amplifier; and
for each of the gain, phase, and efficiency characteristics, generate a three-dimensional plot of the characteristic with respect to an input power and the modulated supply voltage applied to the amplifier.

14. The measurement system of claim 13, wherein, under normal operating conditions of the amplification stage, at least one of the three-dimensional plots of the gain, phase, or efficiency characteristics is used to determine one of the plurality of different shaping functions to use for a shaping table to meet a system gain, phase, or efficiency objective.

15. The measurement system of claim 13, wherein the measurement system is adapted to generate each of the three-dimensional plots by data fitting the measured parameters.

16. The measurement system of claim 15 wherein the data fitting comprises determining the non-memory effects of the amplifier by solving a least squares polynomial fit to determine polynomial coefficients based on the measured parameters.

17. The measurement system of claim 16, wherein each test region with a different applied shaping function is treated independently.

18. The measurement system of claim 16, wherein a non-memory model of distortion of the amplifier comprises:

$$y(n) = [x(n)|x(n)|^0 \ x(n)|x(n)|^1 \ \ldots \ x(n)|x(n)|^P] \begin{bmatrix} a_0 \\ a_1 \\ \ldots \\ a_P \end{bmatrix}$$

where y(n) denotes a current complex baseband output from the amplifier as detected by a receiver, x(n) denotes the corresponding time-aligned, complex baseband input sample to the amplifier as detected by the receiver, and p is a polynomial order.

19. The measurement system of claim 15 wherein the data fitting is extended to include memory effects.

20. A measurement system for characterizing an envelope tracking amplification stage comprising an amplifier for amplifying an input signal and an envelope tracking modulated power supply for generating a modulated supply voltage for the amplifier in dependence on an envelope of the input signal, wherein the envelope of the input signal supplied to the envelope tracking modulated power supply is shaped by a shaping function, the measurement system comprising:
generating circuitry for generating an input test waveform which is representative of an input waveform under normal operating conditions of the amplification stage;
application circuitry for applying a respective one of a plurality of different shaping functions, each comprising a non-linear transfer function, to the envelope of the input signal in each of a plurality of test periods during a period in which the input test waveform is applied as the input signal;
measurement circuitry for measuring parameters of the amplification stage during the period in which the input test waveform is applied in order to allow determination of gain, phase, and efficiency characteristics of the amplifier; and
generating circuitry for generating, for each of the gain, phase, and efficiency characteristics, a three-dimensional plot of the characteristic with respect to an input power and the modulated supply voltage applied to the amplifier.

* * * * *